United States Patent
Gu et al.

(10) Patent No.: US 9,087,632 B2
(45) Date of Patent: Jul. 21, 2015

(54) CABLE MAGNET RING

(71) Applicants: HONG FU JIN PRECISION INDUSTRY (ShenZhen) CO., LTD., Shenzhen (CN); HON HAI PRECISION INDUSTRY CO., LTD., New Taipei (TW)

(72) Inventors: Feng Gu, Shenzhen (CN); Qiang Chai, Shenzhen (CN)

(73) Assignees: HONG FU JIN PRECISION INDUSTRY (ShenZhen) CO., LTD., Shenzhen (CN); HON HAI PRECISION INDUSTRY CO., LTD., New Taipei (TW)

( * ) Notice: Subject to any disclaimer, the term of this patent is extended or adjusted under 35 U.S.C. 154(b) by 83 days.

(21) Appl. No.: 13/972,869

(22) Filed: Aug. 21, 2013

(65) Prior Publication Data

US 2015/0034379 A1 Feb. 5, 2015

(30) Foreign Application Priority Data

Aug. 5, 2013 (CN) .......................... 2013 1 0334971

(51) Int. Cl.
*H05K 9/00* (2006.01)
*H01F 17/06* (2006.01)

(52) U.S. Cl.
CPC .............. *H01F 17/06* (2013.01); *H05K 9/0066* (2013.01)

(58) Field of Classification Search
CPC .................................................... H05K 9/0066
USPC .............................. 174/360, 382, 391; 336/92
See application file for complete search history.

(56) References Cited

U.S. PATENT DOCUMENTS

| | | | | | |
|---|---|---|---|---|---|
| 5,373,277 | A | * | 12/1994 | Naito | 336/92 |
| 5,506,909 | A | * | 4/1996 | Perng | 381/94.1 |
| 5,736,672 | A | * | 4/1998 | Huang | 174/377 |
| 5,920,250 | A | * | 7/1999 | Watanabe et al. | 336/92 |
| 5,942,964 | A | * | 8/1999 | Takeuchi | 336/92 |
| 6,023,023 | A | * | 2/2000 | Takeuchi | 174/92 |
| 6,261,361 | B1 | * | 7/2001 | Iida et al. | 117/19 |
| 6,469,589 | B2 | * | 10/2002 | Takeda | 333/12 |
| 6,633,000 | B2 | * | 10/2003 | Kuo | 174/92 |
| 2011/0031006 | A1 | * | 2/2011 | Chen et al. | 174/350 |
| 2012/0177377 | A1 | * | 7/2012 | Feldstein et al. | 398/135 |
| 2012/0205367 | A1 | * | 8/2012 | Kawai et al. | 220/4.21 |

* cited by examiner

*Primary Examiner* — Hung V Ngo
(74) *Attorney, Agent, or Firm* — Novak Druce Connolly Bove + Quigg LLP

(57) ABSTRACT

A cable magnet ring of adjustable length and able to include anti-EMI magnets of different strengths includes a bracket and a number of pairs of magnetic blocks. The bracket includes a first connecting member and a second connecting member detachably mounted to the first connecting member. The magnetic blocks are detachably received in the first and second connecting members. The first connecting member is movable relative to the second connecting member, to adjust a length of the bracket. Through holes for receiving a cable are defined in the shape of each pair of magnetic blocks, in the first connecting member, and in the second connecting member.

12 Claims, 4 Drawing Sheets

CABLE MAGNET RING

BACKGROUND

1. Technical Field

The present disclosure relates to a cable magnet ring.

2. Description of Related Art

A magnet ring is fitted about a cable for preventing electromagnetic interference (EMI). The resistance of the cable gradually increases with service life of the cable, so the effect of EMI on the cable is gradually increased. However, the magnet ring is not adjusted accordingly, thus, the magnet ring cannot shield the cable from EMI effectively after having been used for a long time.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure, including the accompanying drawings, is illustrated by way of example and not by way of limitation. It should be noted that references to "an" or "one" embodiment in this disclosure are not necessarily to the same embodiment, and such references mean "at least one."

Figure 1:
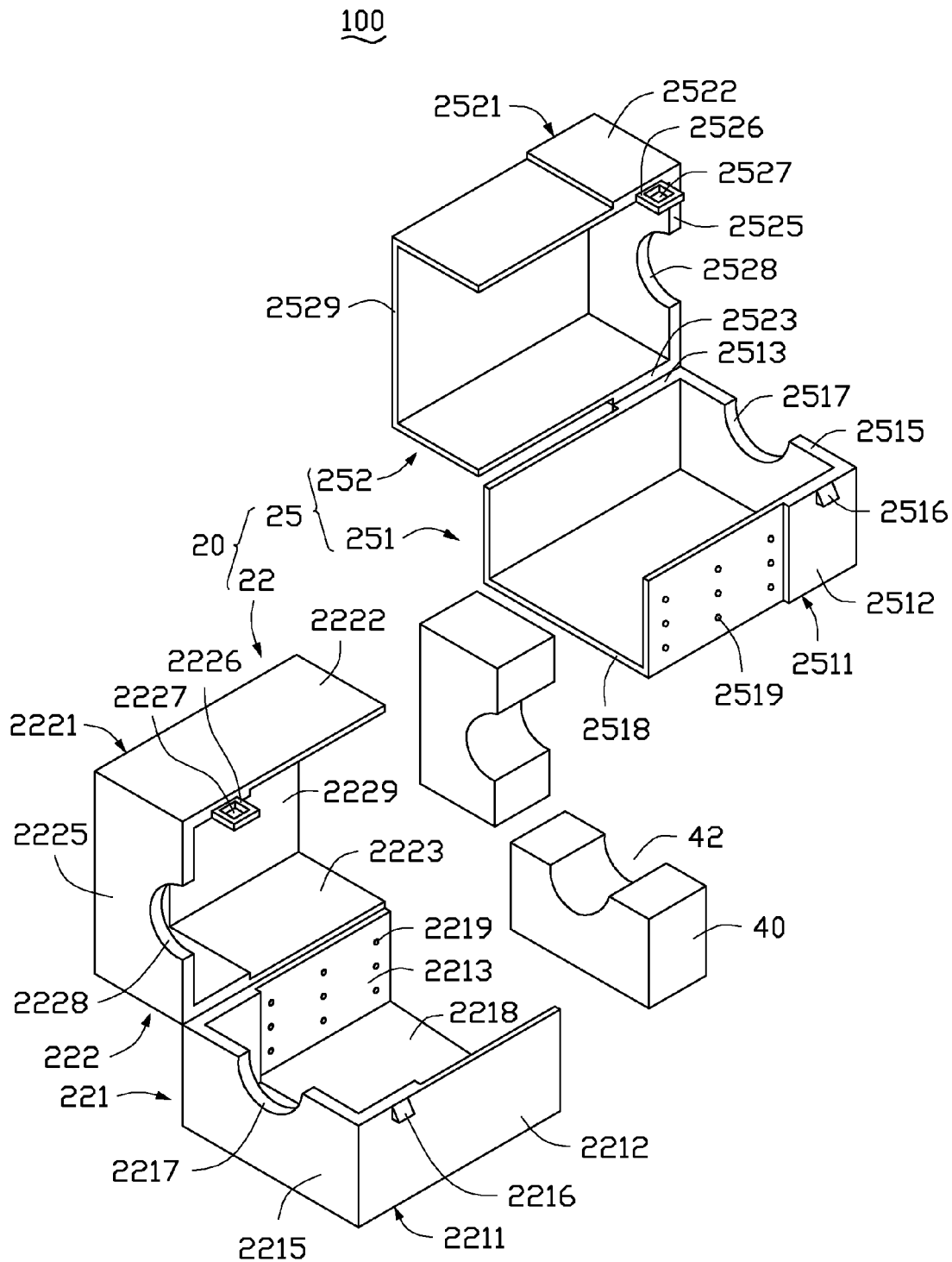
FIG. 1 is an exploded, isometric view of an embodiment of a cable magnet ring.

FIG. 1 shows an embodiment of a cable magnet ring 100 including a bracket 20 and a plurality pairs of magnetic blocks 40.

The bracket 20 includes a first connecting member 22 and a second connecting member 25.

The first connecting member 22 includes a first base 221 and a first cover 222. The first base 221 includes a first bottom plate 2211, a first front plate 2212 perpendicularly extending up from a front side of the first bottom plate 221, a first rear plate 2213 extending up from a rear side of the first bottom plate 221 opposite to the first front plate 2212, and a first end plate 2215 perpendicularly extending up from an end of the first bottom plate 221 and connected between the first front plate 2212 and the first rear plate 2213. A wedge-shaped latching block 2216 protrudes out from an upper portion of the first front plate 2212, and is adjacent to the first end plate 2215. A middle of an upper portion of the first end plate 2215 defines a semicircular cutout 2217. Inner surfaces of the first bottom plate 2211, the first front plate 2212, and the first rear plate 2213 define a first sleeving space 2218. The first sleeving space 2218 is away from the first end plate 2215. The first front plate 2212 and the first rear plate 2213 define a plurality of position holes 2219 communicating with the first sleeving slot 2218.

The first cover 222 includes a first top plate 2221, a second front plate 2222 perpendicularly extending down from a front side of the first top plate 2221, a second rear plate 2223 extending down from a rear side of the first top plate 2221 opposite to the second front plate 2222, and a second end plate 2225 perpendicularly extending down from an end of the first top plate 2221, the second end plate 2225 being connected between the second front plate 2222 and the second rear plate 2223. A bottom side of the second rear plate 2223 is rotatably connected to a top side of the first rear plate 2213. A resilient latching piece 2226 protrudes down from a bottom side of the second front plate 2222. The latching piece 2226 is adjacent to the second end plate 2225. The latching piece 2226 defines a latching hole 2227. A middle of a lower portion of the second end plate 2225 defines a semicircular cutout 2228. Inner surfaces of the first top plate 2221, the second front plate 2222, and the second rear plate 2223 define a second sleeving space 2229. The second sleeving space 2229 is away from the second end plate 2225.

The second connecting member 25 includes a second base 251 and a second cover 252. The second base 251 includes a second bottom plate 2511, a third front plate 2512 perpendicularly extending up from a front side of the second bottom plate 2511, a third rear plate 2513 extending up from a rear side of the second bottom plate 2511 opposite to the third front plate 2512, and a third end plate 2515 perpendicularly extending up from an end of the second bottom plate 2511, the third end plate 2515 being connected between the third front plate 2512 and the third rear plate 2513. A wedge-shaped latching block 2516 protrudes out from an upper portion of the third front plate 2512, and is adjacent to the third end plate 2515. A middle of an upper portion of the third end plate 2515 defines a semicircular cutout 2517. A substantially U-shaped first sliding shell 2518 extends out from ends of the third front plate 2512, the second bottom plate 2511, and the third rear plate 2513, away from the third end plate 2515. A plurality of hemispherical protuberances 2519 protrude out from front and rear sides of the first sliding shell 2518.

The second cover 252 includes a second top plate 2521, a fourth front plate 2522 perpendicularly extending down from a front side of the second top plate 2521, a fourth rear plate 2523 extending down from a rear side of the second top plate 2521 opposite to the fourth front plate 2522, and a fourth end plate 2525 perpendicularly extending down from an end of the second top plate 2521, the fourth end plate 2525 being connected between the fourth front plate 2522 and the fourth rear plate 2523. A bottom side of the fourth rear plate 2523 is rotatably connected to a top side of the third rear plate 2513. A resilient latching piece 2526 protrudes down from a bottom side of the fourth front plate 2522. The latching piece 2526 is adjacent to the fourth end plate 2525. The latching piece 2526 defines a latching hole 2527. A middle of a lower portion of the fourth end plate 2525 defines a semicircular cutout 2528. A substantially U-shaped second sliding shell 2529 extends out from ends of the fourth front plate 2522, the second top plate 2521, and the fourth rear plate 2523, away from the fourth end plate 2525.

Each magnetic block 40 is rectangular, and a middle of a side of the magnetic block 40 defines a semicircular cutout 42.

Figure 2:
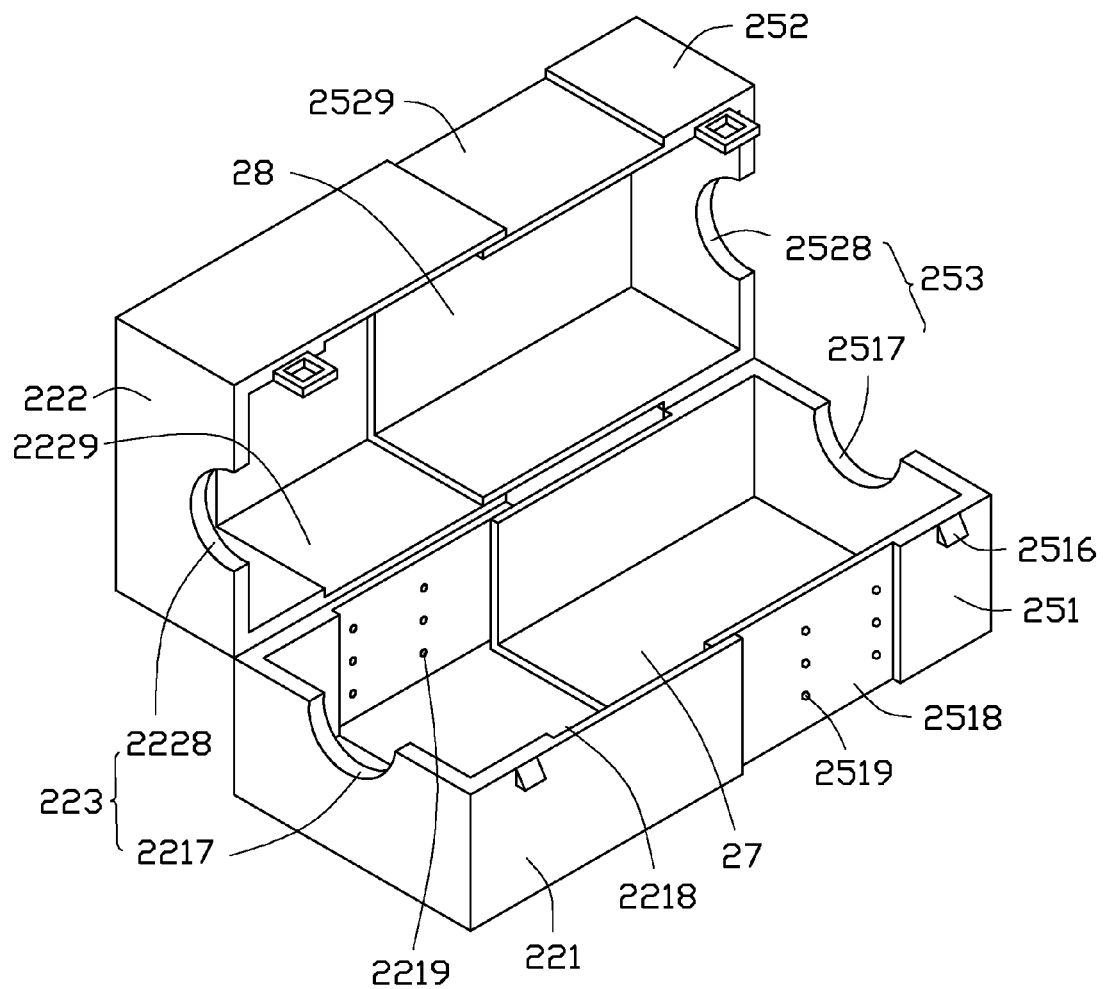
FIG. 2 is a partially assembled, isometric view of the cable magnet ring of FIG. 1.
Figure 3:
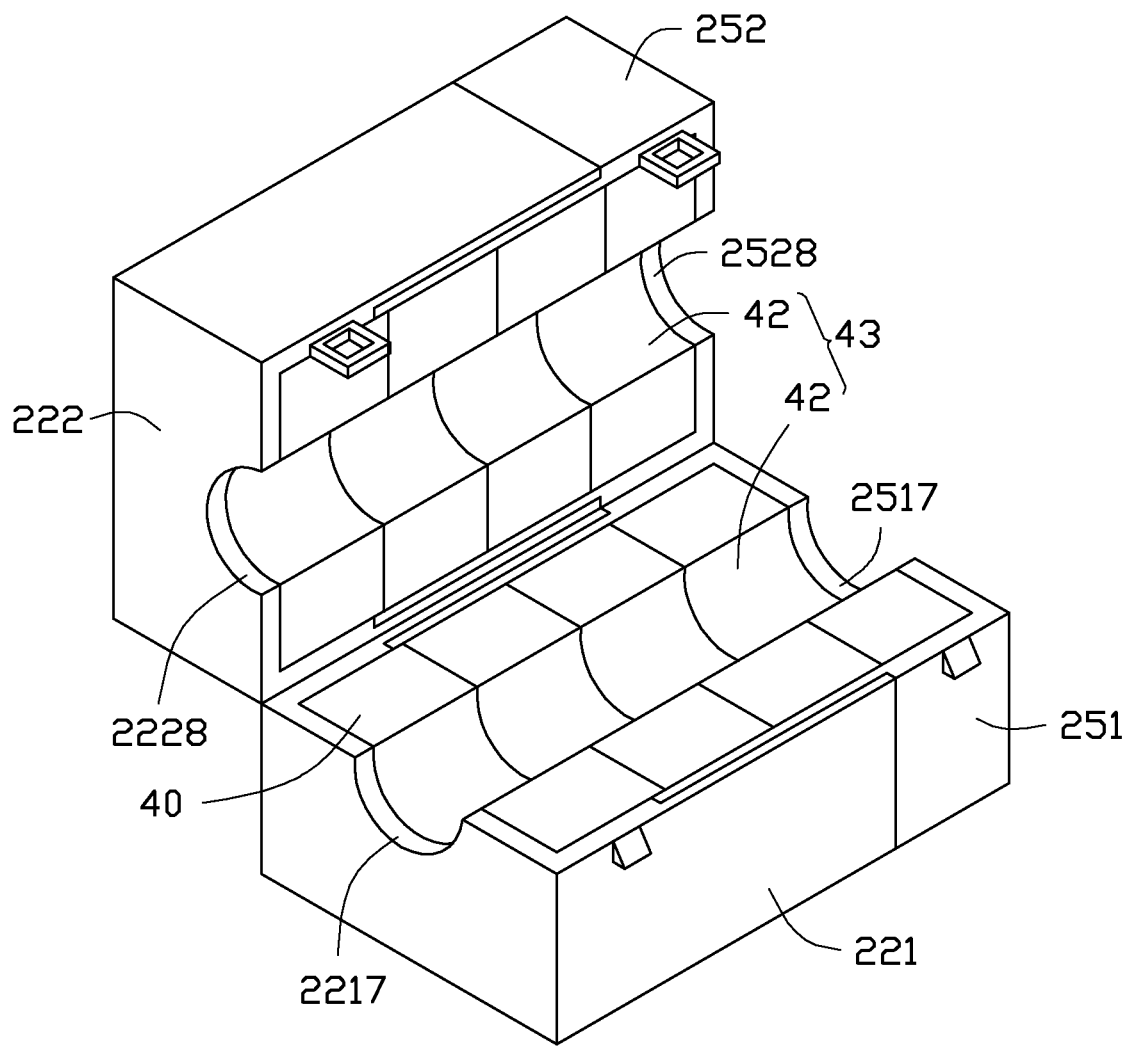
FIG. 3 is an assembled, isometric view of the cable magnet ring of FIG. 1.

FIGS. 2 and 3 show that, in assembly of the cable magnet ring 100, the first sliding shell 2518 and the second sliding shell 2529 are slidably inserted into the first sleeving slot 2218 and the second sleeving space 2229 respectively, to facilitate the latching of the protuberances 2519 in the position holes 2219. Thus, the first base 221 and the second base 251 cooperatively bound a first receiving space 27, and the first cover 222 and the second cover 252 cooperatively bound a second receiving space 28. One of the magnetic block 40 of each pair of magnetic blocks 40 is received in the first receiving space 27, with the cutout 42 aligning with the cutouts 2217 and 2517 of the first and second bases 221 and 251. The other magnetic block 40 of each pair of magnetic blocks 40 is received in the second receiving space 28, with the cutouts 42 aligning with the cutouts 2228 and 2528 of the first cover 222 and the second cover 252. The cutout 2217 of the first base 221 and the cutout 2228 of the first cover 2228 cooperatively bound a through hole 223 for receiving a cable 300 (shown in FIG. 4), the cutout 2517 of the second base 251 and the cutout 2528 of the second cover 252 cooperatively bound a through hole 253 for receiving the cable 300, and the cutouts 42 of each pair of magnetic blocks 40 cooperatively bound a through hole 43 for receiving the cable 300.

In use, a lower portion of the cable 300 is received in the cutout 2217 of the first base 221, the cutout 2517 of the second base 251, and the cutouts 42 of the magnetic blocks 40 received in the first receiving space 27. The first cover 222 and the second cover 252 are rotated toward the first base 221 and the second base 251 respectively, until the latching blocks 2216 and 2516 latch in the latching holes 2227 and 2527. An upper portion of the cable 300 is received in the cutout 2228 of the first cover 222, the cutout 2528 of the second cover 252, and the cutouts 42 of the magnetic blocks 40 received in the second receiving space 28. The cable 300 is thus sandwiched between the magnetic blocks 40 for preventing electromagnetic interference (EMI).

Figure 4:
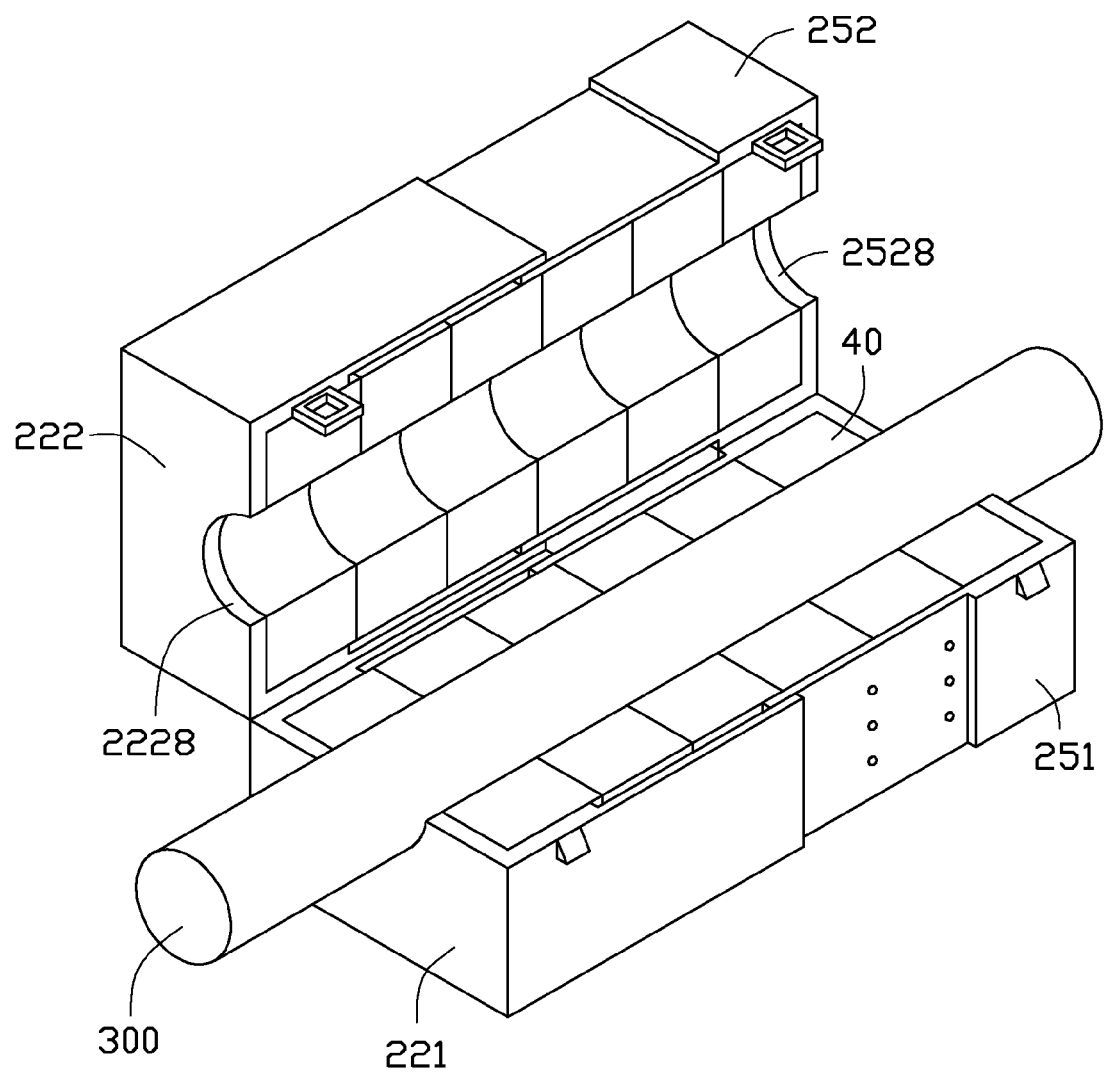
FIG. 4 is similar to FIG. 3, but showing a different state of use.

FIG. 4 shows the cable magnet ring 100 used in another state. When the resistance of the cable 300 increases after being used for a long time, the effects of EMI are increased. The latching pieces 2226 and 2526 are pulled away from the latching blocks 2216 and 2516, to detach the latching blocks 2216 and 2516 from the latching holes 2227 and 2527. The first cover 222 and the second cover 252 are rotated away from the first base 221 and the second base 251 respectively. The second connecting member 25 is pulled away from the first connecting member 22. The protuberances 2519 are detached from the position holes 2219. Therefore, the lengths of the first and second receiving spaces 27 and 28 are increased, until the protuberances 2519 are latched in other position holes 2219. More pairs of magnetic blocks 40 can then be installed in the increased space of the first and second receiving spaces 27 and 28.

Even though numerous characteristics and advantages of the embodiments have been set forth in the foregoing description, together with details of the structure and the functions of the embodiments, the disclosure is illustrative only, and changes may be made in details, especially in the matters of shape, size, and arrangement of parts within the principles of the embodiments to the full extent indicated by the broad general meaning of the terms in which the appended claims are expressed.

What is claimed is:

1. A cable magnet ring, comprising:
a bracket comprising a first connecting member and a second connecting member detachably mounted to the first connecting member; and
a plurality pairs of magnetic blocks detachably received in the first and second connecting members;
wherein the first connecting member is moved relative to the second connecting member, to adjust a length of the bracket such that the number of the pairs of magnetic blocks received in the first and second connecting members is adjusted; and each pair of magnetic blocks, the first connecting member, and the second connecting member each define a through hole for receiving a cable.

2. The cable magnet ring of claim 1, wherein the first connecting member comprises a first base and a first cover covered on the first base, the second connecting member comprises a second base and a second cover covered on the second base, same ends of the second base and the second cover are inserted into same ends of the first base and the first cover, respectively, the first base and the second base cooperatively bound a first receiving space, and the first cover and the second cover cooperatively bound a second receiving space, the magnetic blocks of each pair are received in the first and second receiving spaces, respectively.

3. The cable magnet ring of claim 2, wherein the first base comprises a first bottom plate, a first front plate, a first rear plate, and a first end plate, inner surfaces of the first bottom plate, the first front plate, and the first rear plate define a first sleeving space away from the first end plate, the second base is slidably received in the first sleeving space of the first base.

4. The cable magnet ring of claim 3, wherein the first cover comprises a first top plate, a second front plate, a second rear plate, and a second end plate, inner surfaces of the first top plate, the second front plate, and the second rear plate define a second sleeving space away from the second end plate, the second cover is slidably received in the second sleeving space of the first cover.

5. The cable magnet ring of claim 4, wherein the second base comprises a second bottom plate, a third front plate, a third rear plate, and a third end plate, a first sliding shell extends out from ends of the second bottom plate, the third front plate, and the third rear plate away from the third end plate, the first sliding shell is received in the first sleeving space of the first base, a bottom of the second rear plate is rotatably connected to a top of the first rear plate; the first bottom plate, the first front plate, the first rear plate, and the first end plate of the first base and the second bottom plate, the third front plate, the third rear plate, and the third end plate of the second base cooperatively bound the first receiving space.

6. The cable magnet ring of claim 5, wherein the through hole of the first connecting member comprises two opposite cutouts communicating with each other and defined in the third and fourth end plates, respectively.

7. The cable magnet ring of claim 5, wherein an inner surface of the first front plate defines a plurality of position holes, a plurality of protuberances protrudes out from the first sliding shell, and the plurality of protuberances is detachably latched in the plurality of position holes.

8. The cable magnet ring of claim 5, wherein an inner surface of the first rear plate defines a plurality of position holes, a plurality of protuberances protrudes out from the first sliding shell, and the plurality of protuberances is detachably latched in the plurality of position holes.

9. The cable magnet ring of claim 5, wherein a resilient latching piece protrudes down from a bottom of the second front plate, a latching block protrudes out from the first front plate, the latching piece defines a latching hole, the latching block is detachably latched in the latching hole of the latching piece.

10. The cable magnet ring of claim 9, wherein the through hole of the second connecting member comprises two opposite cutouts communicating with each other and defined in the first and second end plates, respectively.

11. The cable magnet ring of claim 5, wherein the second cover comprises a second top plate, a fourth front plate, a fourth rear plate, and a fourth end plate, a second sliding shell extends out from ends of the fourth front plate, the second top plate, and the fourth rear plate away from the fourth end plate, the second sliding shell is received in the second sleeving space, a bottom of the fourth rear plate is rotatably connected to a top of the third rear plate; the first top plate, the second front plate, the second rear plate, and the second end plate of the first cover and the second top plate, the fourth front plate, the fourth rear plate, and the fourth end plate cooperatively bound the second receiving space.

12. The cable magnet ring of claim 1, wherein the through hole of each pair of magnetic blocks comprises two opposite cutouts communicating with each other and defined in the magnets.

* * * * *